United States Patent
Noh et al.

(10) Patent No.: US 10,296,155 B2
(45) Date of Patent: May 21, 2019

(54) ELECTRODE CONNECTING STRUCTURE, TOUCH SENSOR AND IMAGE DISPLAY DEVICE

(71) Applicant: DONGWOO FINE-CHEM CO., LTD., Jeollabuk-do (KR)

(72) Inventors: Sung Jin Noh, Gyeonggi-do (KR); Min Soo Seo, Gyeonggi-do (KR); Byung Jin Choi, Incheon (KR); Cheol Hun Lee, Gyeonggi-do (KR); Eung Goo Cho, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 0 days.

(21) Appl. No.: 15/911,685

(22) Filed: Mar. 5, 2018

(65) Prior Publication Data

US 2018/0253170 A1   Sep. 6, 2018

(30) Foreign Application Priority Data

Mar. 6, 2017 (KR) .................. 10-2017-0028090
Mar. 22, 2017 (KR) .................. 10-2017-0036169

(51) Int. Cl.
   *G06F 3/044*   (2006.01)
   *C23C 14/08*   (2006.01)
   *H05K 3/04*    (2006.01)
   *G02F 1/1333*  (2006.01)

(52) U.S. Cl.
   CPC ............ *G06F 3/044* (2013.01); *C23C 14/086* (2013.01); *H05K 3/046* (2013.01); *G02F 1/13338* (2013.01); *G06F 2203/04111* (2013.01); *G06F 2203/04112* (2013.01); *H05K 2201/0108* (2013.01)

(58) Field of Classification Search
   None
   See application file for complete search history.

(56) References Cited

U.S. PATENT DOCUMENTS

2010/0171718 A1* 7/2010 Denda .................... G06F 3/044
                                                                345/173
2017/0017321 A1* 1/2017 Teramoto ............... G06F 3/044

FOREIGN PATENT DOCUMENTS

| KR | 10-2011-0093069 A | 8/2011 |
| KR | 10-2012-0017165 A | 2/2012 |
| KR | 10-2014-0092366 A | 7/2014 |
| KR | 10-2015-0068617 A | 6/2015 |
| KR | 10-2016-0022727 A | 3/2016 |

(Continued)

OTHER PUBLICATIONS

Office action dated Oct. 10, 2018 from Korean Patent Office in a counterpart Korean Patent Application No. 10-2017-0036169 (English translation is submitted herewith.).

(Continued)

*Primary Examiner* — Nicholas J Lee
(74) *Attorney, Agent, or Firm* — The PL Law Group, PLLC

(57) ABSTRACT

A touch sensor includes a base layer, a plurality of sensing electrodes and a conductive capping pattern covering each of the sensing electrodes. Each of the sensing electrodes includes a first transparent conductive oxide pattern, a metal pattern and a second transparent conductive oxide pattern which are sequentially stacked on the base layer.

18 Claims, 7 Drawing Sheets

(56) References Cited

FOREIGN PATENT DOCUMENTS

| KR | 10-2016-0033571 A | 3/2016 |
|----|-------------------|--------|
| KR | 10-2016-0093184 A | 8/2016 |

OTHER PUBLICATIONS

Office action dated Jan. 7, 2019 from Korean Patent Office in a counterpart Korean Patent Application No. 10-2017-0028090 (English translation is submitted herewith.).

* cited by examiner

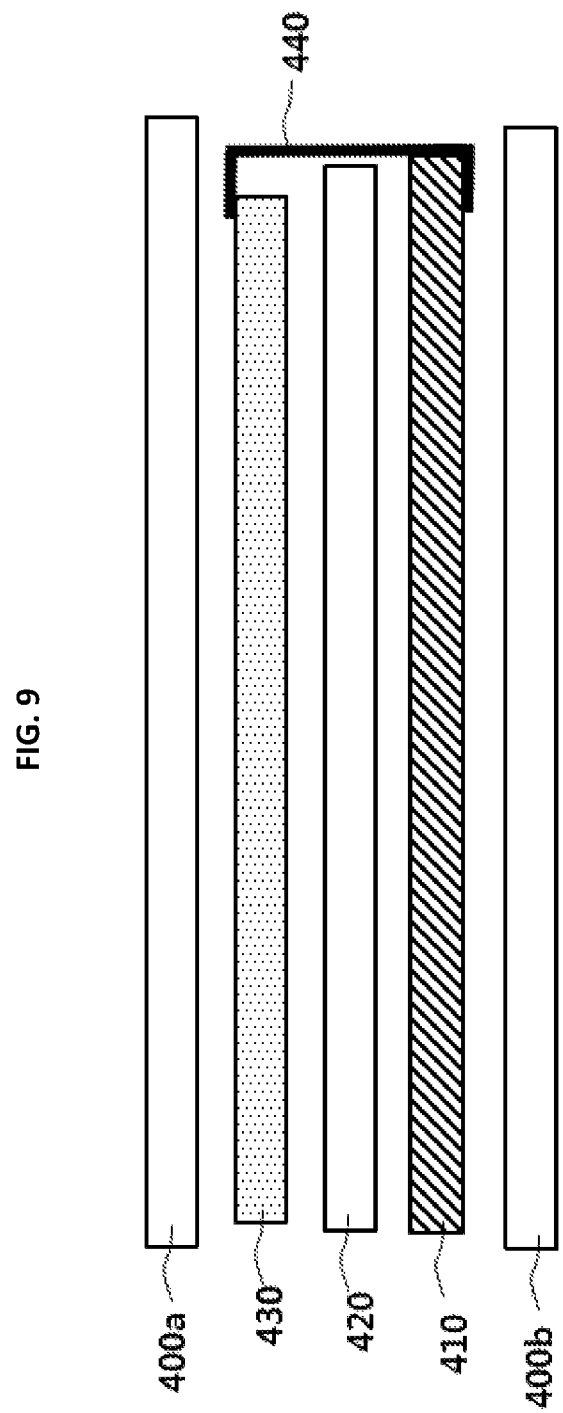

ELECTRODE CONNECTING STRUCTURE, TOUCH SENSOR AND IMAGE DISPLAY DEVICE

CROSS-REFERENCE TO RELATED APPLICATION AND CLAIM OF PRIORITY

This application claims priority to Korean Patent Applications No. 10-2017-0028090 filed on Mar. 6, 2017 and No. 10-2017-0036169 filed on Mar. 22, 2017 in the Korean Intellectual Property Office (KIPO), the entire disclosure of which is incorporated by reference herein.

BACKGROUND

1. Field

The present invention relates to an electrode connecting structure, a touch sensor and an image display device.

2. Description of the Related Art

As information technologies are being developed, various demands in display devices having thinner dimension, lightweight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch screen panel capable of inputting a user's direction by selecting an instruction displayed in a screen is also developed. The touch screen panel may be combined with the display device so that display and information input functions may be implemented in one electronic device.

The touch screen panel is categorized as a capacitance type, a light-sensitive type, a resistive type, etc., according to an operational mechanism thereof. In a capacitance type touch sensor, when an object or a human hand touches the touch sensor, a capacitance change generated by a conductive sensing pattern with a neighboring sensing pattern or a ground electrode may be detected so that a touched positional information may be converted into an electrical signal.

The conductive sensing pattern included in the touch sensor is also required to have high transmittance and improved electrical property (e.g., a low electrical resistance) for being employed in a display device. Further, high resistance to a deformation due to a moisture or an air is also needed in the conductive sensing pattern.

Further, the display device has become thinner, and a flexible display device having a bending or folding property is being developed. Thus, the conductive sensing pattern having improved flexible property in the touch sensor is also required to be employed to the flexible display device.

For example, a touch screen panel including a touch sensor is employed in various image display devices as disclosed in Korean Patent Publication No. 2014-0092366. However, demands for a thin-layered touch sensor or touch panel having improved optical property and sensitivity are continuously increasing.

SUMMARY

According to an aspect of the present invention, there is provided an electrode connecting structure having improved electrical connection reliability.

According to an aspect of the present invention, there is provided a touch sensor having improved optical, electrical and mechanical properties.

According to an aspect of the present invention, there is provided a touch screen panel or an image display device which includes a touch sensor having improved optical, electrical and mechanical properties.

The above aspects of the present inventive concepts will be achieved by the following features or constructions:

(1) A touch sensor, comprising: a base layer; a plurality of sensing electrodes each of which includes a first transparent conductive oxide pattern, a metal pattern and a second transparent conductive oxide pattern sequentially stacked on the base layer; and a conductive capping pattern covering each of the sensing electrodes.

(2) The touch sensor according to the above (1), wherein the first transparent conductive oxide pattern, the second transparent conductive oxide pattern and the conductive capping pattern include independently at least one selected from the group consisting of indium tin oxide (ITO), indium zinc oxide (IZO), indium zinc tin oxide (IZTO), aluminum zinc oxide (AZO), zinc oxide (ZnOx), indium oxide (InOx), tin oxide (SnOx), cadmium tin oxide (CTO), gallium-doped zinc oxide (GZO), zinc tin oxide (ZTO) and indium gallium oxide (IGO).

(3) The touch sensor according to the above (1), wherein the metal pattern includes at least one metal selected from the group consisting of gold (Au), silver (Ag), copper (Cu), aluminum (Al), platinum (Pt), palladium (Pd), chromium (Cr), tungsten (W), titanium (Ti), tantalum (Ta), iron (Fe), cobalt (Co), nickel (Ni), zinc (Zn), tellurium (Te), vanadium (V), niobium (Nb) and molybdenum (Mo), an alloy thereof or a nanowire thereof.

(4) The touch sensor according to the above (1), wherein the sensing electrode includes a mesh pattern structure.

(5) The touch sensor according to the above (1), wherein the conductive capping pattern covers a sidewall and a top surface of the sensing electrode.

(6) The touch sensor according to the above (1), wherein a width of the conductive capping pattern is increased as the conductive capping pattern becomes nearer to the base layer.

(7) The touch sensor according to the above (1), further comprising: an insulation layer covering the sensing electrodes; and a bridge pattern formed through the insulation layer to electrically connect neighboring ones of the sensing electrodes to each other, wherein the bridge pattern is in contact with the conductive capping pattern.

(8) A touch sensor, comprising: a base layer; a plurality of sensing electrodes arranged on the base layer; and a bridge pattern electrically connecting neighboring ones of the sensing electrodes to each other, wherein at least one of the sensing electrode or the bridge pattern has a stack structure including a first transparent conductive oxide pattern, a metal pattern and a second transparent conductive oxide pattern, and includes a conductive capping pattern covering a surface of the stack structure.

(9) The touch sensor according to the above (8), wherein the conductive capping pattern includes a conductive metal oxide.

(10) An electrode connecting structure, comprising: a pad; a passivation layer partially covering the pad, the passivation layer including a contact hole through which the pad is partially exposed; a conductive capping pattern covering the pad through the contact hole; an intermediate layer covering the conductive capping pattern; and a circuit structure on the intermediate layer.

(11) The electrode connecting structure according to the above (10), wherein the conductive capping pattern is formed along a top surface of the passivation layer, a sidewall of the contact hole and a top surface of the pad exposed through the contact hole.

(12) The electrode connecting structure according to the above (10), wherein the pad includes a first transparent conductive oxide pattern, a metal pattern and a second transparent conductive oxide pattern which are sequentially stacked.

(13) The electrode connecting structure according to the above (12), wherein the conductive capping pattern is in contact with a top surface of the second transparent conductive oxide pattern.

(14) The electrode connecting structure according to the above (10), wherein the intermediate layer includes at least one of a conductive resin, a conductive paste, a conductive ball or an anisotropic conductive film.

(15) The electrode connecting structure according to the above (14), wherein the intermediate layer covers an entire top surface of the conductive capping pattern and fills a remaining portion of the contact hole.

(16) The electrode connecting structure according to the above (10), wherein the circuit structure includes a flexible printed circuit board (FPCB).

(17) A touch sensor comprising the electrode connecting structure according to the above (10).

(18) An image display device comprising the touch sensor according to the above (1).

According to exemplary embodiments of the present invention, the sensing electrode may be formed as a multi-layered structure including a first transparent conductive oxide pattern, a metal pattern and a second transparent conductive oxide pattern. Thus, a transmittance of a touch sensor may be improved, and a channel resistance of the sensing electrode may be reduced to obtain a high sensitivity. Further, a flexible property such as a bending or folding property may be also improved by the metal pattern inserted in the middle of the sensing electrode.

In exemplary embodiments, a conductive capping pattern covering a surface of the sensing electrode may be formed. Damage or corrosion of the metal pattern by a contact with moisture or air may be prevented by the conductive capping pattern. Thus, the touch sensor having high reliability with respect to an external environment may be achieved.

The conductive capping pattern may be also formed on a pad in a wiring region, and thus a reliability of the pad that may be exposed for a connection with a driving circuit may be also improved.

The touch sensor may be applied to an image display device such as flexible OLED, LCD devices with high electrical and mechanical reliability.

BRIEF DESCRIPTION OF THE DRAWINGS

FIG. 9 is a schematic cross-sectional view illustrating an image display device in accordance with exemplary embodiments.

DETAILED DESCRIPTION

According to exemplary embodiments of the present invention, there is provided a touch sensor that comprises a base layer, a plurality of sensing electrodes each of which includes a first transparent conductive oxide pattern, a metal pattern and a second transparent conductive oxide pattern sequentially stacked on the base layer, and a conductive capping pattern covering each surface of the sensing electrodes. An anti-corrosion property of the sensing electrode may be improved by the conductive capping pattern, and a desired electrical property of the touch sensor may be maintained with high reliability.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
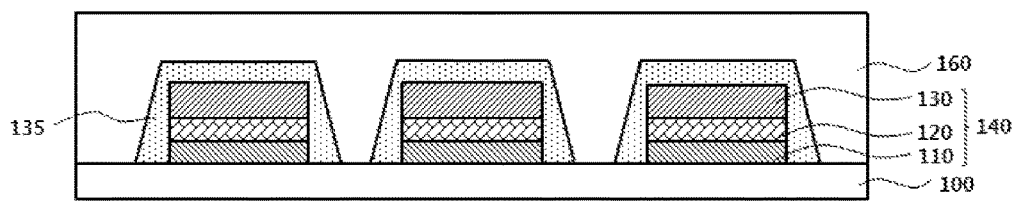
FIG. 1 is a schematic cross-sectional view illustrating a touch sensor in accordance with exemplary embodiments.
Figure 2:
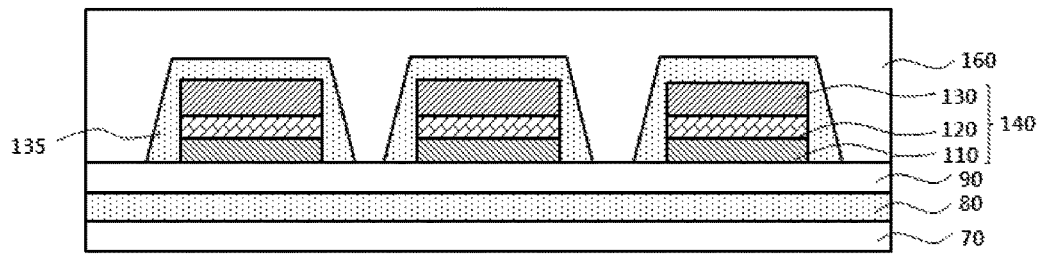
FIG. 2 is a schematic cross-sectional view illustrating a touch sensor in accordance with exemplary embodiments.
Figure 3:
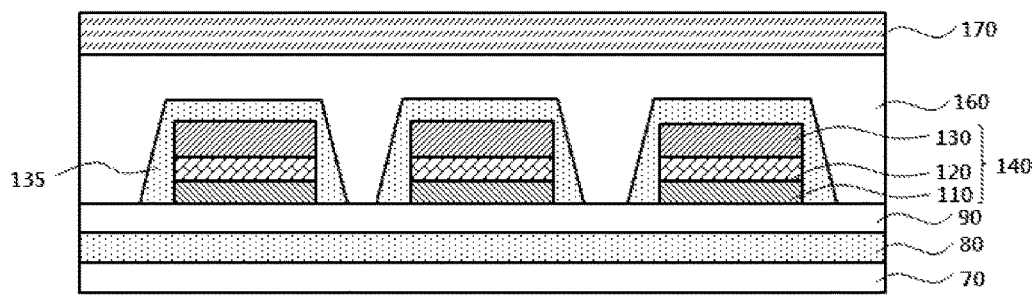
FIG. 3 is a schematic cross-sectional view illustrating a touch sensor in accordance with exemplary embodiments.

FIGS. 1 to 3 are schematic cross-sectional views illustrating touch sensors in accordance with exemplary embodiments.

Referring to FIG. 1, the touch sensor may include a base layer 100, sensing electrodes 140 disposed on the base layer 100 and a passivation layer 160 covering the sensing electrodes 140.

The base layer 100 may serve as a supporting layer for a formation of the sensing electrode 140. The term "base layer" used herein indicates a lower member of the sensing electrode 140. For example, the base layer 100 may include a film type member or a substrate. The base layer 100 may also include an object (e.g., a display panel of an image display device) on which the sensing electrode 140 is formed.

The base layer 100 may include a glass, a plastic or a flexible resin such as polyimide (PI), polycarbonate (PC), polyethylene terephthalate (PET), polymethyl methacrylate (PMMA), triacetyl cellulose (TAC), etc.

The sensing electrode 140 may include a first transparent conductive oxide pattern 110, a metal pattern 120 and a second transparent conductive oxide pattern 130 sequentially formed on the base layer 100.

The first conductive oxide pattern 110 may serve as a barrier to, e.g., an organic material diffused from the base layer 100. The first conductive oxide pattern 110 may also serve as a lower barrier or a lower protective pattern of the metal pattern 120.

For example, the first transparent conductive oxide pattern 110 may include a conductive metal oxide such as indium tin oxide (ITO), indium zinc oxide (IZO), indium zinc tin oxide (IZTO), aluminum zinc oxide (AZO), zinc oxide (ZnOx), indium oxide (InOx), tin oxide (SnOx), cadmium tin oxide (CTO), gallium-doped zinc oxide (GZO), zinc tin oxide (ZTO), indium gallium oxide (IGO), etc. These may be used alone or in a combination thereof.

In an embodiment, the first transparent conductive oxide pattern 110 may be formed of IZO for improving a crystallization property at a low temperature and a barrier property.

In an embodiment, the first transparent conductive oxide pattern 110 may be formed to have a thickness from about 10 nm to about 70 nm. If the thickness of the first transparent conductive oxide pattern 110 is less than about 10 nm, a sufficient barrier property to the organic material may not be obtained. If the thickness of the first transparent conductive oxide pattern 110 exceeds about 70 nm, a resistance of the sensing electrode 140 may be excessively increased and a uniform pattern shape may not be achieved.

In an embodiment, a refractive index of the first transparent conductive oxide pattern 110 may be in a range from about 1.7 to about 2.2 in consideration of an optical matching with the metal pattern 120.

For example, the metal pattern 120 may include a metal such as gold (Au), silver (Ag), copper (Cu), aluminum (Al), platinum (Pt), palladium (Pd), chromium (Cr), tungsten (W), titanium (Ti), tantalum (Ta), iron (Fe), cobalt (Co), nickel (Ni), zinc (Zn), tellurium (Te), vanadium (V), niobium (Nb), molybdenum (Mo), etc., an alloy thereof (e.g., silver-palladium-copper (APC)), or a nanowire of the metal or the alloy. In an embodiment, the metal pattern 120 may be formed of APC for implementing a low resistance and a high sensitivity.

The metal pattern 120 may be included in the sensing electrode 140 so that a flexible property may be improved and a channel resistance of the sensing electrode 140 may be reduced compared to the sensing electrode consisting of the transparent conductive oxide.

For example, a thickness of the metal pattern 120 may be in a range from about 5 nm to about 30 nm.

The second transparent conductive oxide pattern 130 may include the above-mentioned conductive metal oxide. The second transparent conductive oxide pattern 130 may include a conductive metal oxide the same as or different from that of the first transparent conductive oxide pattern 110.

In an embodiment, the second transparent conductive oxide pattern 130 may be formed of ITO in consideration of a conductivity and a transmittance of the touch sensor or the sensing electrode 140.

In an embodiment, a thickness of the second transparent conductive oxide pattern 130 may be in a range from about 10 nm to about 140 nm. The second transparent conductive oxide pattern 130 may be thicker than the first transparent conductive oxide pattern 110 so that damages of the metal pattern 120 may be prevented during an etching process for a formation of the sensing electrode 140.

For example, if the thickness of the second transparent conductive oxide pattern 130 is less than about 10 nm, a sufficient upper barrier of the metal pattern 120 may not be provided. If the thickness of the second transparent conductive oxide pattern 130 exceeds about 140 nm, the transmittance of the touch sensor may be decreased, and the etching process for the formation of the sensing electrode 140 may not be easily performed.

In an embodiment, a refractive index of the second transparent conductive oxide pattern 130 may be on a range from about 1.7 to about 2.2 in consideration of an optical matching with the metal pattern 120.

In exemplary embodiments, the sensing electrode 140 may include a mesh pattern structure. For example, the first transparent conductive oxide pattern 110, the metal pattern 120 and/or the second transparent conductive oxide pattern 130 included in the sensing electrode 140 may be formed as the mesh pattern structure.

The mesh pattern may include a net or honeycomb shaped inner structure. The mesh pattern may include a rectangular mesh structure, a rhombus mesh structure, a hexagonal mesh structure, etc., or may include a concave polygonal mesh structure.

The sensing electrode 140 may include the mesh pattern structure as described above so that a bending property may be enhanced, and flexible and stretchable properties of the touch sensor may be further improved.

According to exemplary embodiments of the present invention, a conductive capping pattern 135 may be formed on a surface of each sensing electrode 140. In exemplary embodiments, the conductive capping pattern 135 may cover a top surface and a sidewall of each sensing electrode 135.

A sidewall of the metal pattern 1420 may be covered by the conductive capping pattern 135 so that a corrosion or an oxidation of the metal pattern 120 by an external moisture or air may be prevented. Additionally, an organic material that may not be blocked by the first transparent conductive oxide pattern 110 may be prevented from contacting the sidewall of the metal pattern 120.

The conductive capping pattern 135 may be formed on a conductive metal oxide having an improved chemical resistance relatively to that of a metal while having desired conductivity and transmittance. In an embodiment, the conductive capping pattern 135 may include ITO or IZO.

A thickness of the conductive capping pattern 135 (e.g., a thickness from a top surface of the sensing electrode 140) may be in a range from about 30 nm to about 300 nm. If the thickness of the conductive capping pattern 135 is less than about 30 nm, a thickness from the sidewall of the sensing electrode 140 may be also reduced and a sufficient barrier property with respect to the metal pattern 120 may not be implemented.

In an embodiment, the thickness of the conductive capping pattern 135 may be controlled in a range from about 30 nm to about 50 nm so that a resistance increase of the sensing electrode 140 due to an excessive thickness of the conductive capping pattern 135 may be avoided.

In an embodiment, as illustrated in FIG. 1, the conductive capping pattern 130 may have a substantially trapezoidal cross-sectional shape. For example, the conductive capping pattern 130 may have a tapered shape such that a width of the conductive capping pattern 130 may be increased from a top surface thereof to a base layer 100.

Thus, while an etching process for forming the conductive capping pattern 135, an insufficient barrier property due to a reduction of a thickness of the conductive capping pattern 135 adjacent to the metal pattern 120 may be prevented. Further, a thickness of a portion of the conductive capping pattern 135 which may be in contact with the base layer 100 may be increased so that a diffusion of the organic material from the base layer 100 may be effectively suppressed.

For example, a first transparent conductive oxide layer, a metal layer and a second transparent conductive oxide layer may be formed by a deposition process such as a sputtering process or a coating process of a conductive composition.

A photo-lithography process using a first photo-mask may be performed so that the second transparent conductive oxide layer, the metal layer and the first transparent conductive oxide layer may be sequentially etched to form the sensing electrodes 140.

A conductive capping layer covering the sensing electrodes 140 may be formed, and the conductive capping layer may be patterned by a photo-lithography process using a second photo-mask to form the conductive capping pattern 135.

For example, the conductive capping pattern 135 may have a spacer shape formed on an outer wall of the sensing electrode 140.

The passivation layer 160 may be formed on the base layer 100 to cover the sensing electrodes 140 and the conductive capping pattern 135. The passivation layer 160 may include, e.g., an inorganic insulation material such as silicon oxide or an organic material.

According to exemplary embodiments as described above, the sensing electrode 140 may include a triple-layered structure including the first transparent conductive oxide pattern 110—the metal pattern 120—the second transparent conductive oxide pattern 130. The metal pattern 120 may be inserted in the sensing electrode 140 so that a channel resistance may be reduced to improve sensitivity and flexibility of the touch sensor. Further, the metal pattern 120 may be sandwiched between the first and second conductive oxide patterns 110 and 130 so that transmittance of the touch sensor may be improved, and corrosive damages of the metal pattern 120 may be suppressed.

Additionally, the sidewall of the metal pattern 120 may be covered by the conductive capping pattern 135 so that reliability of the metal pattern 120 may be also enhanced from an external environment.

For example, a refractive index of the conductive capping pattern 135 may be in a range from about 1.7 to about 2.2. Thus, a refractive index matching with respect to a light toward to the sidewall of the metal pattern 120 may be also implemented so that the sensing electrode 140 may be prevented from being viewed by a user of a display device including the touch sensor.

Referring to FIG. 2, an intermediate layer may serve as a base layer for forming the sensing electrode 140. The intermediate layer may have a single-layered structure or a multi-layered structure. In exemplary embodiments, the intermediate layer may include a first intermediate layer 80 and a second intermediate layer 90. At least one of the first intermediate layer 80 and the second intermediate layer 90 may include an organic polymer.

In exemplary embodiments, the first intermediate layer 80 may serve as a functional layer facilitating a detachment process or a separation process from a carrier substrate. For example, the first intermediate layer 80 may include polyimide, poly vinyl alcohol, polyamic acid, polyamide, polyethylene, polystyrene, polynorbornene, phenylmaleimide copolymer, polyazobenzene, polyphenylenephthalamide, polyester, polymethyl methacrylate, polyarylate, cinnamate, coumarin, phthalimidine, chalcone, an aromatic acetylene-based polymer, etc. These may be used alone or in a combination thereof.

The second intermediate layer 90 may be formed to protect the sensing electrode 140 during the detachment process. Further, the second intermediate layer 90 may include an inorganic insulation material such as silicon oxide, silicon nitride or silicon oxynitride, or a polymeric organic insulation material.

In some embodiments, the carrier substrate may be separated from the first intermediate layer 80 by the detachment process, and then a substrate 70 may be combined with a lower surface of the first intermediate layer 80. For example, the substrate 70 may be attached to the first intermediate layer 80 using an adhesive layer. The substrate 70 may include a flexible resin film such as polyimide or an optical functional layer such as a polarizing film.

Referring to FIG. 3, an optical function layer 170 may be formed on the passivation layer 160. For example, the optical functional layer 170 may include a coating polarizer or a stretched polarizing plate.

The stretched polarizing plate may include a protective film and a polarizer. An adhesive layer may be coated on the protective film, and the polarizing plate may be stacked on the passivation layer 160.

In an embodiment, the optical functional film 170 may include a retardation plate, a hard coating layer, a color adjusting layer, etc.

Figure 4:
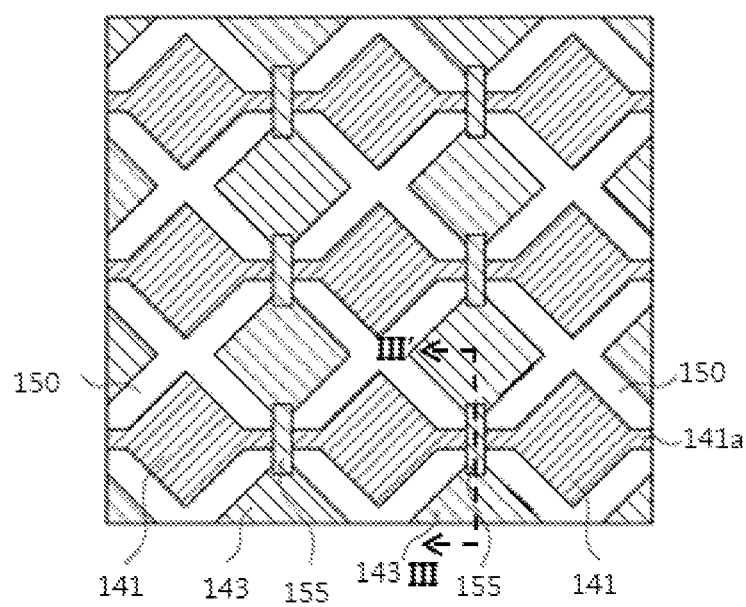
FIGS. 4 and 5 are a top plane view and a cross-sectional view, respectively, illustrating a construction of sensing electrodes in a touch sensor in accordance with some exemplary embodiments.
Figure 5:
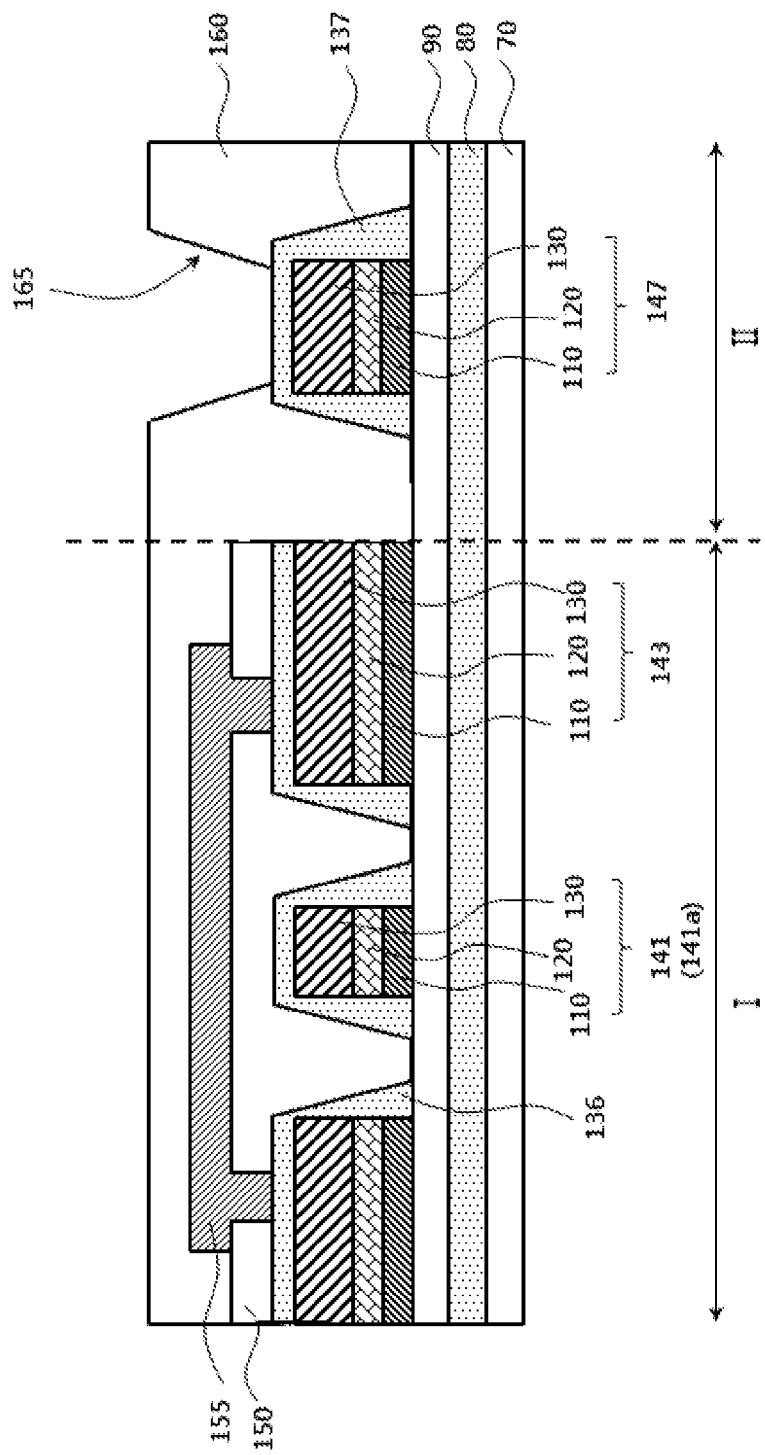

FIGS. 4 and 5 are a top plane view and a cross-sectional view, respectively, illustrating a construction of sensing electrodes in a touch sensor in accordance with some exemplary embodiments. For example, FIG. 5 includes a cross-sectional view taken along a line III-III' of FIG. 4 in a thickness direction of the touch sensor. For example, FIG. 4 is a top plane view of a first region I indicated in FIG. 5.

Detailed descriptions on elements and/or materials substantially the same as or similar to those described with reference to FIGS. 1 to 3 are omitted herein.

Referring to FIGS. 4 and 5, the touch sensor may include a first region I and a second region II. For example, the first region I may correspond to a sensing region in which a touched position may be detected to generate a positional information. The second region II may correspond to a wiring region or a trace region of the touch sensor. Accordingly, a base layer including the first intermediate layer 80 and the second intermediate layer 90 may be also divided into the first region I and the second region II.

Sensing electrodes 141 and 143 may be disposed on the first region I of the touch sensor, and may each include a stack structure of the first transparent conductive oxide pattern 110, the metal pattern 120 and the second transparent conductive oxide pattern 130. The sensing electrodes may include a first sensing electrode 141 and a second sensing electrode 143. A first conductive capping pattern 136 may be formed on each surface of the sensing electrodes 141 and 143.

The first sensing electrode 141 may include, e.g., polygonal unit patterns connected by a connecting portion 141a along a row direction. Thus, a first sensing line in the row direction may be defined, and a plurality of the first sensing lines may be arrange along a column direction.

The second sensing electrode 143 may include, e.g., island patterns physically isolated from each other. The second sensing electrodes 143 may be physically and electrically separated from the first sensing electrodes 141. For example, the second sensing electrodes 143 may face each other in the row direction to be isolated from each other with respect to the connecting portion 141a of the first sensing electrode 141.

For example, an insulation layer 150 may be formed on the second intermediate layer 90. The insulation layer 150 may cover the first and second sensing electrodes 141 and 143, and the first conductive capping pattern 136, and may fill a space between the first sensing electrode 141 and the second sensing electrode 143. In some embodiments, the insulation layer 150 may be formed selectively on the first region I.

For example, the insulation layer 150 may include an inorganic insulation material such as silicon oxide or a transparent organic material such as an acryl-based resin. Preferably, the insulation layer 150 may be formed of an organic resin composition including a thermally curable or photo-curable material such as an epoxy compound, an acryl compound, a melanin compound, etc.

The insulation layer 150 may include a first contact hole through which a top surface of the first conductive capping pattern 136 formed on the second sensing electrode 143 may be at least partially exposed. For example, an exposure process and a developing process may be performed using a third photo-mask on the insulation layer 150 to form the first contact hole.

A bridge pattern 155 may be disposed on the insulation layer 150. The bridge pattern 155 may fill the first contact holes such that a pair of the second sensing electrodes 143 neighboring each other in the column direction may be electrically connected via the bridge pattern 155.

The bridge pattern 155 may directly contact the first conductive capping pattern 136 that may cover the second sensing electrode 143 on the first region I. The first conductive capping pattern 136 may serve as an intermediate electrode between the bridge pattern 155 and the second sensing electrode 143.

A second sensing line extending in the column direction may be defined by the bridge pattern 155 and the second sensing electrodes 143 while being insulated from the first sensing electrodes 141. A plurality of the second sensing lines may be arranged along the row directions.

In some embodiments, the bridge pattern 155 may have a structure substantially the same as or similar to that of the sensing electrode 141 and 143. For example, the bridge pattern 155 may have a stack structure of a first transparent conductive oxide pattern-a metal pattern-a second transparent conductive oxide pattern, and may include a conductive capping pattern covering the stack structure.

In some embodiments, one of the bridge pattern 155 or the sensing electrode 141 and 143 may include the above-mentioned stack structure and the conductive capping pattern. In some embodiments, the sensing electrode 141 and 143 and the bridge pattern 155 may each include the above-mentioned stack structure and the conductive capping pattern.

The first and second sensing lines may be connected to, e.g., wirings or traces of the touch sensor, and the wiring or the trances may be connected to an external circuit or a driving circuit via a pad 147 disposed on the second region II.

In exemplary embodiments, the pad 147 may also have a structure of the first transparent conductive oxide 110, the metal pattern 120 and the second transparent conductive oxide pattern 130. Further, a second conductive capping pattern 137 may cover a sidewall and a top surface of the pad 147.

In some embodiments, the pad 147 may be formed by an etching process substantially the same as that for the sensing electrodes 141 and 143. The first and second conductive capping patterns 136 and 137 may be also formed by substantially the same etching process.

A passivation layer 160 may be formed commonly on the first and second regions I and II, and may cover the bridge pattern 155.

A second contact hole 165 may be formed at a portion of the passivation layer 160 formed on the second region II. An external circuit such as a flexible printed circuit board (FPBC) may be electrically connected to the pad 147 via the second contact hole 165.

In exemplary embodiments, a top surface of the second conductive capping pattern 137 may be exposed through the second contact hole 165. The pad 147 that may be exposed to an external air through the second contact hole 165 may be covered by the second conductive capping pattern 137 so that a resistance increase or a signal transfer failure due to an oxidation or a corrosion of the pad 147 (e.g., the metal pattern 120 included in the pad 147) may be prevented.

Additionally, an organic material included in the passivation layer 160 may be prevented from being diffused into the metal pattern 120 by the second conductive capping pattern 137.

In some embodiments, the pad 147 and/or the bridge pattern 155 may include a mesh pattern structure substantially the same as or similar to that of the sensing electrode.

In some embodiments, the touch sensor may be operated in a mutual capacitance type.

In some embodiments, the touch sensor may be operated in a self-capacitance type. In this case, the sensing electrode may include an isolated unit pattern, and each unit pattern may be connected to a trace or a wiring. The bridge pattern may be omitted herein. In an embodiment, the trace or the wiring may be also covered or surrounded by a conductive capping pattern.

Figure 6:
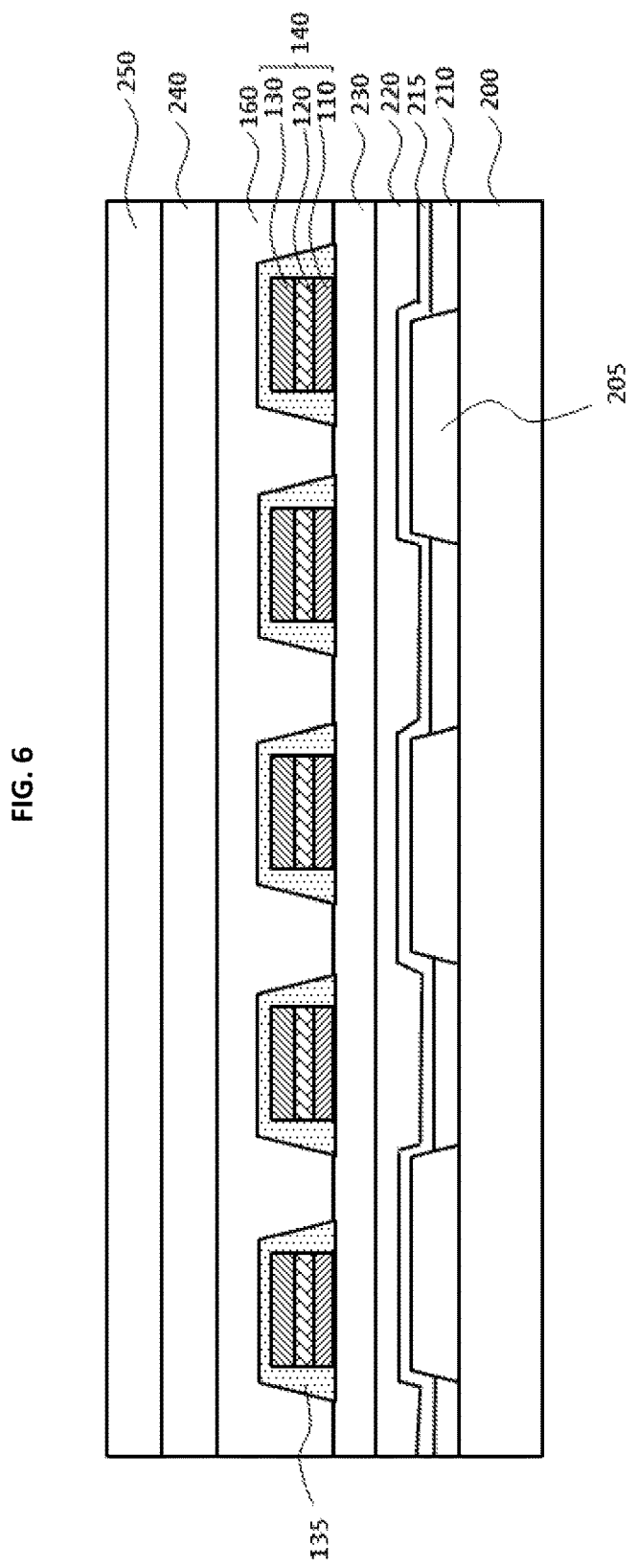
FIG. 6 is a schematic cross-sectional view illustrating an image display device in accordance with exemplary embodiments.

FIG. 6 is a schematic cross-sectional view illustrating an image display device in accordance with exemplary embodiments.

Referring to FIG. 6, the image display device may include a base substrate 200, a pixel defining layer 205, a display layer 210, an electrode 215, insulating interlayers 220 and 230, a sensing electrode 140, a passivation layer 160, an optical layer 240 and a window substrate 250.

The base substrate 200 may be a supporting substrate of the image display device. In exemplary embodiments, the base substrate 200 may include a flexible resin material such as polyimide. In this case, the image display device may be provided as a flexible display device.

The pixel defining layer 205 may be formed on the base substrate 200 to expose a pixel region from which a color or an image may be implemented. A thin film transistor (TFT) array may be formed between the base substrate 200 and the pixel defining layer 205, and an insulation structure covering the TFT array may be formed. The pixel defining layer 205 may be formed on the insulation structure, and a pixel electrode (e.g., an anode) that may be formed through the insulation structure to be electrically connected to the TFT may be exposed by the pixel defining layer 205.

The display layer 210 may be formed at each pixel region exposed by the pixel defining layer 205. The display layer 210 may include, e.g., an organic light-emitting material, and the image display device may be provided as an OLED device. The display layer 210 may include a liquid crystal material, and the image display device may be provided as an LCD device.

The electrode 215 may be disposed on the pixel defining layer 205 and the display layer 210. The electrode 215 may serve as an opposing electrode facing the pixel electrode. The electrode 215 may serve as a cathode of the image display device, and may be a common electrode continuously extending on a plurality of the pixel regions.

The insulating interlayers 220 and 230 may be formed on the electrode 215. The insulating interlayers may include a first insulating interlayer 220 and a second insulating interlayer 230. The first insulating interlayer 220 may serve as a planarization layer, and the second insulating interlayer 230 may serve as an encapsulation layer.

The touch sensor according to example embodiments as described above may be disposed on the insulating interlayer. The touch sensor may include a sensing electrode 140 including a first transparent conductive oxide pattern 110, a metal pattern 120 and a second transparent conductive oxide pattern 130. A surface of the sensing electrode 140 may be substantially encapsulated by a conductive capping pattern 135.

As described above, the sensing electrode 140 may have an improved transmittance, and thus the sensing electrodes 140 may be distributed both on the pixel defining layer 205 and the pixel regions. In some embodiments, the sensing electrodes 140 may substantially overlap the pixel defining layer 205, and may not overlap the pixel region.

A passivation layer 160 covering the sensing electrodes 140 may be formed of the second insulating interlayer 230. The optical layer 240 and the window substrate 250 may be stacked on the passivation layer 160.

The optical layer 240 may include an functional layer such as a polarizer, a polarizing plate, a retardation film, etc., which may be capable of improving an optical property, a transmittance, etc., of the image display device. The window substrate 250 may serve as an encapsulation layer that may be exposed to a user of the image display device.

The touch sensor according to exemplary embodiments may be applied to, e.g., a flexible OLED device so that the image display device having improved bending property while also having enhanced durability and reliability with respect to an external environment may be achieved.

Figure 7:
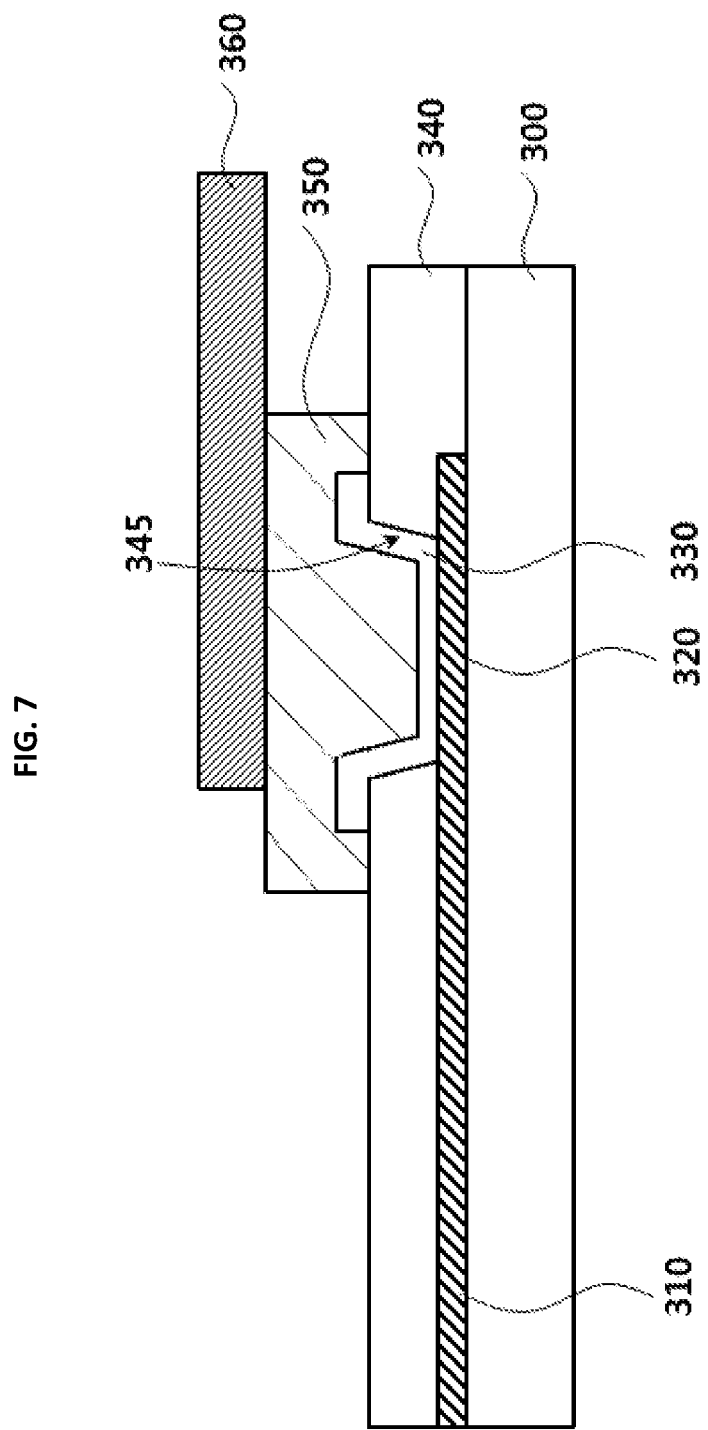
FIG. 7 is a schematic cross-sectional view illustrating an electrode connecting structure in accordance with exemplary embodiments.

FIG. 7 is a schematic cross-sectional view illustrating an electrode connecting structure in accordance with exemplary embodiments. The electrode connecting structure may be disposed on a wiring region or a trace region of a touch sensor. In exemplary embodiments, the electrode connecting structure may be included in the second region II of the touch sensor illustrated in FIG. 5.

Referring to FIG. 7, the electrode connecting structure may include a pad 320 and a conductive capping pattern 330, and may also include an intermediate layer 350 and a circuit structure 360.

The pad 320 may be disposed on the base layer 300. The base layer 300 may include a supporting layer or a lower member for forming the pad 320. For example, the base layer 300 may include a film type member or a substrate. The base layer 300 may also include an object (e.g., a display panel of an image display device) on which the pad 320 is formed.

For example, the pad 320 may include a metal such as gold (Au), silver (Ag), copper (Cu), aluminum (Al), platinum (Pt), palladium (Pd), chromium (Cr), tungsten (W), titanium (Ti), tantalum (Ta), iron (Fe), cobalt (Co), nickel (Ni), zinc (Zn), tellurium (Te), vanadium (V), niobium (Nb), molybdenum (Mo), etc., or an alloy thereof (e.g., silver-palladium-copper (APC)).

The pad 320 may include a transparent conductive oxide such as indium tin oxide (ITO), indium zinc oxide (IZO), indium zinc tin oxide (IZTO), aluminum zinc oxide (AZO), zinc oxide (ZnOx), indium oxide (InOx), tin oxide (SnOx), cadmium tin oxide (CTO), gallium-doped zinc oxide (GZO), zinc tin oxide (ZTO), indium gallium oxide (IGO), etc.

In some embodiments, the pad 320 may be integral with a wiring 310, and may be formed at an end of the wiring 310. The pad 320 may be connected with a single wiring 310, or a plurality of the wirings 310 may be merged by the pad 320.

A passivation layer 340 may be formed on the base layer 300 to partially cover the pad 320. The passivation layer 340 may also cover the wiring 310 connected to the pad 320.

In some embodiments, the passivation layer 340 may include an organic insulation material such as a polysiloxane-based, an acryl-based or a polyimide-based material. The organic insulation material may include a photo-sensitive polymer.

In some embodiments, the passivation layer 340 may include an inorganic insulation material such as silicon oxide.

In exemplary embodiments, the passivation layer 340 may include a contact hole 345 through which the pad 320 may be partially exposed. For example, the contact hole 340 may be formed by an exposure process and/or a developing process using a photo-mask with respect to the passivation layer 340.

In some embodiments, a top surface of the pad 320 may be partially exposed through the contact hole 345.

The conductive capping pattern 330 may be electrically connected to the pad 320 through the contact hole 245. In some embodiments, the conductive capping pattern 330 may be formed at a sidewall of the contact hole 345 to directly contact the top surface of the pad 320. The conductive capping pattern 330 may also extend on a top surface of the passivation layer 340. In this case, the conductive capping pattern 330 may be formed conformably along the top surface of the passivation layer 340, the sidewall of the contact hole 345 and the top surface of the pad 320.

In exemplary embodiments, the conductive capping pattern 330 may include a transparent conductive oxide having an improved anti-corrosion property compared to that of a metal. For example, the conductive capping pattern 330 may include ITO, IZO, IZTO, AZO, ZnOx, InOx, SnOx, CTO, GZO, ZTO, IGO, etc.

The pad 320 may be electrically connected to an outer circuit member via the conductive capping pattern 330. In exemplary embodiments, the intermediate layer 350 may be formed on the passivation layer 340 to cover the conductive capping pattern 330, and the circuit structure 360 may be disposed on the intermediate layer 350.

Accordingly, an electrode connecting structure including the pad 320—the conductive capping pattern 330—the intermediate layer 350—the circuit structure 360 may be implemented.

The intermediate layer 350 may entirely cover the conductive capping pattern 330 on the passivation layer 340. In some embodiments, a remaining portion of the contact hole 345 may be filled with the intermediate layer 350. For example, the intermediate layer 350 may fill the contact hole 345 to cover the conductive capping pattern 330, and may also cover a portion of the passivation layer 340.

In exemplary embodiments, the intermediate layer 350 may be formed of a conductive paste, a conductive resin or a conductive ball. Thus, the intermediate layer 350 may also serve as a shock absorbing member during a connecting process, and may cover the conductive capping pattern 330 while easily filling the contact hole 345.

For example, the intermediate layer 350 may be formed from a anisotropic conductive film (ACF).

Accordingly, the intermediate layer 350 may include a structure formed by coating or printing the conductive paste, the conductive resin, the conductive ball, etc., or a structure formed by attaching the ACF.

The pad 320 may be electrically connected to an outer circuit such as a driving IC via the circuit structure 360. The circuit structure 360 may include various wiring or electrodes. In some embodiments, the circuit structure 360 may include a flexible printed circuit board (FPCB).

The circuit structure 360 may directly contact the intermediate layer 350, and may be physically isolated from the conductive capping pattern 330 by the intermediate layer 350.

According to exemplary embodiments as described above, the pad 320 electrically connected to the circuit structure 360 may be partially covered by the passivation layer 340, and then an exposed portion of the pad 320 may be protected by the conductive capping pattern 330. Thus, the pad 320 may be prevented from being directly exposed to an external environment or the intermediate layer 350. Therefore, corrosion, oxidation or damage of the pad 320 by external corrosive materials such as an air, a moisture or an organic material may be avoided.

The conductive capping pattern 330 may be also formed on the top surface of the passivation layer 340 as well as on an inner wall of the contact hole 345, so that a contact area with the intermediate layer 350 may be increased. Thus, the corrosion of the pad 320 may be further prevented and a resistance increase may be suppressed.

Additionally, the conductive capping pattern 330 may also serve as a buffer pattern mitigating stress or shock applied to the pad 320 during a connecting process of the intermediate layer 350 and the circuit structure 360. Thus, mechanical reliability of the pad 320 may be also enhanced.

Figure 8:
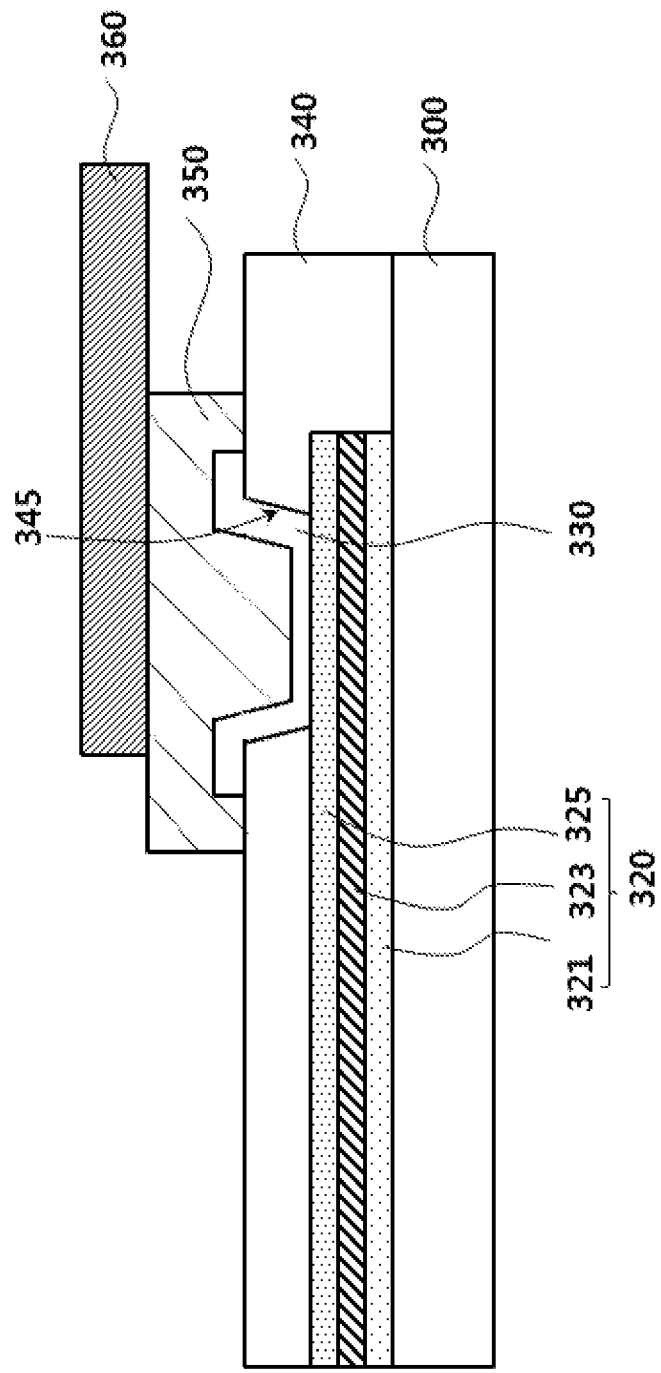
FIG. 8 is a schematic cross-sectional view illustrating an electrode connecting structure in accordance with exemplary embodiments.

FIG. 8 is a schematic cross-sectional view illustrating an electrode connecting structure in accordance with exemplary embodiments.

Referring to FIG. 8, a pad 320 may have a multi-layered structure including different materials. In some embodiments, the pad 320 may have a triple-layered structure including a first transparent conductive oxide pattern 321, a metal pattern 323 and a second transparent conductive oxide pattern 325 sequentially stacked from a top surface of a base layer 300.

The first and second transparent conductive oxide patterns 321 and 325 may include ITO, IZO, IZTO, AZO, ZnOx, InOx, SnOx, CTO, GZO, ZTO, IGO, or the like. The metal pattern 323 may include a metal such as Au, Ag, Cu, Al, Pt, Pd, Cr, W, Ti, Ta, Fe, Co, Ni, Zn, Te, V, Nb, Mo, etc., or an alloy thereof.

In exemplary embodiments, the metal pattern 323 including the metal of a low resistance may be sandwiched between the first and second transparent conductive oxide patterns 321 and 325, so that oxidation or corrosion of the metal pattern 323 may be effectively prevented. For example, an organic material diffused from the base layer 300 may be blocked by the first transparent conductive oxide pattern 321. Further, a multi-layered barrier from an external environment including the second transparent conductive oxide pattern 325 and the conductive capping pattern 330 may be disposed on the metal pattern 323. Thus, a corrosion inducing material caused from a lower member and the external environment of the metal pattern 323 may be substantially blocked.

In some embodiments, the wiring 310 illustrated in FIG. 7 may also have a multi-layered structure substantially the same as that of the pad 320.

In some embodiments, as described with reference to FIGS. 5 and 8, the pad 320 and 147 may have the tripe-layered structure, and the conductive capping pattern 137 surrounding the pad 147 may be formed. In this case, the conductive capping pattern 330 described with reference to FIGS. 7 and 8 may be formed on a sidewall and a bottom of the second contact hole 165 illustrated in FIG. 5. In this case, the conductive capping pattern 137 illustrated in FIG. 5 may serve as a lower conductive capping pattern, and the conductive capping pattern 330 illustrated in FIGS. 7 and 8 may serve as an upper conductive capping pattern.

Accordingly, a stack structure of the lower conductive capping pattern and the upper conductive capping pattern may be disposed on the pad 147 and 320 so that a barrier property with respect to the pad 147 and 320 may be further improved.

FIG. 9 is a schematic cross-sectional view illustrating an image display device in accordance with exemplary embodiments.

Referring to FIG. 9, the image display device may include, e.g., an upper cover 400a, a lower cover 400b, a main board 410, a display panel 420 and a touch sensor 430.

The upper cover 400a may include a window substrate of the image display device. The lower cover 400b may be a rear cover of the image display device, and may include, e.g., a battery cover.

The main board 410 may include a printed circuit board in which a driving circuit, a signal circuit, a ground circuit, etc., may be formed. The display panel may include, e.g., an OLED panel, an LCD panel, or the like.

In exemplary embodiments, the touch sensor 430 may include the touch sensor or the touch screen panel as described with reference to FIGS. 4 and 5. The pad included in the touch sensor 430 may be electrically connected to the main board via a circuit structure 440. The circuit structure 440 may include, e.g., a FPCB. The conductive capping pattern and the intermediate layer may be interposed between the pad and the circuit structure 440 as described with reference to FIGS. 7 and 8.

Hereinafter, preferred embodiments will be described to more concretely understand the present invention with reference to examples. However, it will be apparent to those skilled in the art that such embodiments are provided for illustrative purposes and various modifications and alterations may be possible without departing from the scope and spirit of the present invention, and such modifications and alterations are duly included in the present invention as defined by the appended claims.

Experimental Example 1

A sensing electrode including a first transparent conductive oxide pattern, a metal pattern and a second transparent conductive oxide pattern was formed on a glass substrate according to materials and thickness as shown in Table 1 below. The sensing electrode was patterned to have a width of 30 μm.

A conductive capping pattern was formed of ITO on each sensing electrode of Examples. The formation of the conductive capping pattern was omitted in Comparative Examples.

TABLE 1

| | First Transparent Conductive Oxide Pattern (IZO)(nm) | Metal Pattern (APC)(nm) | Second Transparent Conductive Oxide Pattern (IZO)(nm) | Conductive Capping Pattern (ITO)(nm) |
| --- | --- | --- | --- | --- |
| Example 1 | 40 | 10 | 140 | 300 |
| Example 2 | 40 | 10 | 40 | 135 |
| Comparative Example 1 | 40 | 10 | 140 | — |
| Comparative Example 2 | 40 | 10 | 90 | — |
| Comparative Example 3 | 40 | 10 | 10 | — |
| Comparative Example 4 | 40 | 10 | 40 | — |

The sensing electrodes of Examples and Comparative Examples were left at a temperature of 85° C. and a relative humidity of 85%, and a time at which a corrosion of the metal pattern was observed was measured. The results are shown in Table 2 below.

TABLE 2

| Time | 500 hr | 650 hr | 800 hr | 1000 hr |
|---|---|---|---|---|
| Example 1 | X | X | X | X |
| Example 2 | X | X | X | X |
| Comparative Example 1 | X | X | X | ○ |
| Comparative Example 2 | X | X | X | ○ |
| Comparative Example 3 | X | ○ | — | — |
| Comparative Example 4 | X | X | ○ | — |

Referring to Table 2, the corrosion of the metal pattern in the sensing electrodes of Examples including the conductive capping pattern was not observed even after 1,000 hours. In Comparative Examples, the corrosion of the metal pattern rapidly occurred as the thickness of the second transparent conductive oxide pattern was decreased.

Experimental Example 2: Evaluation of Corrosion of Triple-Layered Pad

A pad and a conductive capping pattern were formed on a glass substrate according to materials and thickness as shown in Table 3 below.

In Example 3, the pad was formed to include a first transparent conductive oxide pattern, a metal pattern and a second transparent conductive oxide pattern. The pad was patterned to have a width of 30 μm.

Subsequently, a passivation layer covering the pad was formed using a photosensitive acryl-based resin. The passivation layer was partially removed using exposure and developing processes to form a contact hole through which a top surface of the pad was partially exposed. ITO was deposited on a sidewall of the contact hole and the top surface of the pad to form the conductive capping pattern.

In Comparative Example 5, processes substantially the same as those of Example 3 were performed except that the conductive capping pattern was omitted.

TABLE 3

| | First Transparent Conductive Oxide Pattern (IZO)(nm) | Metal Pattern (APC)(nm) | Second Transparent Conductive Oxide Pattern (IZO)(nm) | Conductive Capping Pattern (ITO)(nm) |
|---|---|---|---|---|
| Example 3 | 40 | 10 | 140 | 10 |
| Comparative Example 5 | 40 | 10 | 140 | — |

The pads of Example 3 and Comparative Example 5 were left at a temperature of 85° C. and a relative humidity of 85%, and a time at which a corrosion of the pad was observed was measured. The results are shown in Table 4 below.

TABLE 4

| Time | 500 hr | 650 hr | 800 hr | 1000 hr |
|---|---|---|---|---|
| Example 3 | X | X | X | X |
| Comparative Example 5 | X | X | X | ○ |

Referring to Table 4, in the triple-layered pad including the conductive capping pattern thereon of Example 3, the corrosion of the pad was not observed even after 1,000 hours. In Comparative Example 5, the corrosion of the pad was initiated after about 1,000 hours as the formation of the conductive capping pattern was omitted.

Experimental Example 3: Evaluation of Corrosion of Single-Layered Pad

A pad and a conductive capping pattern were formed on a glass substrate according to materials and thickness as shown in Table 5 below.

In Example 4, processes substantially the same as those of Example 3 were performed except that the pad was formed as a single-layered metal pattern.

In Comparative Example 6, processes substantially the same as those of Example 4 were performed except that the conductive capping pattern was omitted.

TABLE 5

| Time | First Transparent Conductive Oxide Pattern (IZO)(nm) | Metal Pattern (APC)(nm) | Second Transparent Conductive Oxide Pattern (IZO)(nm) | Conductive Capping Pattern (ITO)(nm) |
|---|---|---|---|---|
| Example 4 | — | 100 | — | 10 |
| Comparative Example 6 | — | 100 | — | — |

The pads of Example 4 and Comparative Example 6 were left at a temperature of 85° C. and a relative humidity of 85%, and a time at which a corrosion of the pad was observed was measured. The results are shown in Table 6 below.

TABLE 6

| Time | 500 hr | 650 hr | 800 hr | 1000 hr |
|---|---|---|---|---|
| Example 4 | X | X | ○ | ○ |
| Comparative Example 6 | ○ | ○ | ○ | ○ |

Referring to Table 6, in the single-layered metal pad including the conductive capping pattern thereon of Example 4, the corrosion of the pad was not observed until about 800 hours. In Comparative Example 6, the corrosion of the pad was rapidly observed before 500 hour as the formation of the conductive capping pattern was omitted.

What is claimed is:
1. A touch sensor, comprising:
a base layer;
a plurality of sensing electrodes each of which includes a first transparent conductive oxide pattern, a metal pattern and a second transparent conductive oxide pattern sequentially stacked on the base layer; and
a conductive capping pattern covering each of the sensing electrodes.

2. The touch sensor according to claim 1, wherein the first transparent conductive oxide pattern, the second transparent conductive oxide pattern and the conductive capping pattern include independently at least one selected from the group consisting of indium tin oxide (ITO), indium zinc oxide (IZO), indium zinc tin oxide (IZTO), aluminum zinc oxide (AZO), zinc oxide (ZnOx), indium oxide (InOx), tin oxide (SnOx), cadmium tin oxide (CTO), gallium-doped zinc oxide (GZO), zinc tin oxide (ZTO) and indium gallium oxide (IGO).

3. The touch sensor according to claim 1, wherein the metal pattern includes at least one metal selected from the group consisting of gold (Au), silver (Ag), copper (Cu), aluminum (Al), platinum (Pt), palladium (Pd), chromium (Cr), tungsten (W), titanium (Ti), tantalum (Ta), iron (Fe), cobalt (Co), nickel (Ni), zinc (Zn), tellurium (Te), vanadium (V), niobium (Nb) and molybdenum (Mo), an alloy thereof or a nanowire thereof.

4. The touch sensor according to claim 1, wherein the sensing electrode includes a mesh pattern structure.

5. The touch sensor according to claim 1, wherein the conductive capping pattern covers a sidewall and a top surface of the sensing electrode.

6. The touch sensor according to claim 1, wherein a width of the conductive capping pattern is increased as the conductive capping pattern becomes nearer to the base layer.

7. The touch sensor according to claim 1, further comprising:
   an insulation layer covering the sensing electrodes; and
   a bridge pattern formed through the insulation layer to electrically connect neighboring ones of the sensing electrodes to each other,
   wherein the bridge pattern is in contact with the conductive capping pattern.

8. A touch sensor, comprising:
   a base layer;
   a plurality of sensing electrodes arranged on the base layer; and
   a bridge pattern electrically connecting neighboring ones of the sensing electrodes to each other,
   wherein at least one of the sensing electrode or the bridge pattern has a stack structure including a first transparent conductive oxide pattern, a metal pattern and a second transparent conductive oxide pattern, and includes a conductive capping pattern covering a surface of the stack structure.

9. The touch sensor according to claim 8, wherein the conductive capping pattern includes a conductive metal oxide.

10. An electrode connecting structure, comprising:
    a pad;
    a passivation layer partially covering the pad, the passivation layer including a contact hole through which the pad is partially exposed;
    a conductive capping pattern covering the pad through the contact hole;
    an intermediate layer covering the conductive capping pattern; and
    a circuit structure on the intermediate layer.

11. The electrode connecting structure according to claim 10, wherein the conductive capping pattern is formed along a top surface of the passivation layer, a sidewall of the contact hole and a top surface of the pad exposed through the contact hole.

12. The electrode connecting structure according to claim 10, wherein the pad includes a first transparent conductive oxide pattern, a metal pattern and a second transparent conductive oxide pattern which are sequentially stacked.

13. The electrode connecting structure according to claim 12, wherein the conductive capping pattern is in contact with a top surface of the second transparent conductive oxide pattern.

14. The electrode connecting structure according to claim 10, wherein the intermediate layer includes at least one of a conductive resin, a conductive paste, a conductive ball or an anisotropic conductive film.

15. The electrode connecting structure according to claim 14, wherein the intermediate layer covers an entire top surface of the conductive capping pattern and fills a remaining portion of the contact hole.

16. The electrode connecting structure according to claim 10, wherein the circuit structure includes a flexible printed circuit board (FPCB).

17. A touch sensor comprising the electrode connecting structure according to claim 10.

18. An image display device comprising the touch sensor according to claim 1.

* * * * *